(12) United States Patent
Zinn et al.

(10) Patent No.: US 9,481,569 B2
(45) Date of Patent: Nov. 1, 2016

(54) MONOLITHIC CMOS-MEMS MICROPHONES AND METHOD OF MANUFACTURING

(71) Applicant: Robert Bosch GmbH, Stuttgart (DE)

(72) Inventors: John Zinn, Canonsburg, PA (US); Brett Diamond, Pittsburgh, PA (US); Jochen Hoffmann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/888,606

(22) PCT Filed: May 2, 2014

(86) PCT No.: PCT/US2014/036626
§ 371 (c)(1),
(2) Date: Nov. 2, 2015

(87) PCT Pub. No.: WO2014/179721
PCT Pub. Date: Nov. 6, 2014

(65) Prior Publication Data
US 2016/0090303 A1 Mar. 31, 2016

Related U.S. Application Data

(60) Provisional application No. 61/818,641, filed on May 2, 2013, provisional application No. 61/830,492, filed on Jun. 3, 2013.

(51) Int. Cl.
*B81C 1/00* (2006.01)
*H04R 31/00* (2006.01)

(52) U.S. Cl.
CPC ............ *B81C 1/00246* (2013.01); *H04R 31/00* (2013.01); *B81B 2201/0257* (2013.01); *B81C 2201/0132* (2013.01); *H04R 2201/003* (2013.01)

(58) Field of Classification Search
CPC ............... B81C 1/00246; B81C 2201/0132; H04R 31/00; H04R 2201/003
See application file for complete search history.

(56) References Cited

U.S. PATENT DOCUMENTS 8,093,119 B2   1/2012  Hsieh et al.
8,165,324 B2   4/2012  Feyh et al.
(Continued)

FOREIGN PATENT DOCUMENTS

WO    2012012939 A1    2/2012

OTHER PUBLICATIONS

International Search Report and Written Opinion for Application No. PCT/US2014/036626 dated May 2, 2014, 11 pages.

*Primary Examiner* — Fernando L Toledo
*Assistant Examiner* — Neil Prasad
(74) *Attorney, Agent, or Firm* — Michael Best & Friedrich LLP (57) ABSTRACT

Systems and methods are disclosed for manufacturing a CMOS-MEMS device (100). A partial protective layer (401) is deposited on a top surface of a layered structure to cover a circuit region. A first partial etch is performed from the bottom side of the layered structure to form a first gap (501) below a MEMS membrane (207) within a MEMS region of the layered structure. A second partial etch is performed from the top side of the layered structure to remove a portion of a sacrificial layer between the MEMS membrane and a MEMS backplate (215) within the MEMS region. The second partial etch releases the MEMS membrane so that it can move in response to pressures. The deposited partial protective layer prevents the second partial etch from etching a portion of the sacrificial layer positioned within the circuit region of the layered structure and also prevents the second partial etch from damaging the CMOS circuit component (211).

16 Claims, 7 Drawing Sheets

(56) References Cited

U.S. PATENT DOCUMENTS

| | | |
|---|---|---|
| 8,188,557 B2 | 5/2012 | Rombach et al. |
| 8,497,149 B2 | 7/2013 | Laming et al. |
| 8,642,986 B2 | 2/2014 | Tan et al. |
| 2006/0008098 A1 | 1/2006 | Tu |
| 2010/0244162 A1* | 9/2010 | Laming ................ B81B 3/0072 257/416 |
| 2012/0319174 A1 | 12/2012 | Wang |

\* cited by examiner

MONOLITHIC CMOS-MEMS MICROPHONES AND METHOD OF MANUFACTURING

RELATED APPLICATIONS

This application claims the benefit of U.S. Provisional Application No. 61/818,641, filed May 2, 2013, and U.S. Provisional Application No. 61/830,492, filed Jun. 3, 2013, the entirety of both of which are incorporated herein by reference.

BACKGROUND

The present invention relates to micro electrical-mechanical systems (MEMS) devices such as, for example, MEMS microphone systems and methods of manufacturing the same.

SUMMARY

In one embodiment, the invention provides a method of manufacturing a CMOS-MEMS device. A layered structure is provided that includes a substrate layer, a sacrificial layer, a MEMS membrane, a CMOS circuit component, and a MEMS backplate. The MEMS membrane is positioned between the sacrificial layer and the substrate layer within a MEMS region of a horizontal cross-section of the layered structure. The MEMS backplate is positioned adjacent to the sacrificial layer opposite the MEMS membrane. The CMOS circuit component is positioned within a circuit region of the horizontal cross-section of the layered structure. The circuit region and the MEMS region do not overlap on the horizontal cross-section of the layered structure.

The method further includes depositing a partial protective layer on a top surface of the layered structure such that the deposited protective layer covers the circuit region. A first partial etch of the substrate layer is performed from the bottom side of the layered structure to form a first gap below the MEMS membrane within the MEMS region of the layered structure. A second partial etch of the sacrificial layer is performed from the top side of the layered structure to remove the portion of the sacrificial layer between the MEMS membrane and the MEMS backplate within the MEMS region of the layered structure. The second partial etch releases the MEMS membrane so that it can move in response to pressures. The deposited partial protective layer prevents the second partial etch from etching a portion of the sacrificial layer positioned within the circuit region of the layered structure and also prevents the second partial etch from damaging the CMOS circuit component.

In some embodiments, the MEMS membrane is formed of a poly-Si material and the substrate layer is formed of a silicon-based material. The sacrificial layer is formed of an oxide material. The layered structure further includes a protective oxide layer between the poly-Si MEMS membrane and the silicon-based substrate layer. The oxide layer acts as an etch-stop and protects the MEMS membrane during the first partial etch of the substrate layer. The second partial etch then releases the MEMS membrane from both the sacrificial layer and the protective oxide layer.

In another embodiment, the invention provides a method of manufacturing a CMOS-MEMS microphone system. The method includes providing a structure including a poly-silicon microphone membrane, a metal oxide backplate, and an oxide defined gap layer between the membrane and the backplate. The microphone membrane is mounted adjacent to a substrate layer such that the backplate is positioned above the membrane. A CMOS circuit component is integrated into the structure, but is not positioned between the membrane and the backplate. A protective etch stop is deposited over the CMOS circuit component to protect the CMOS circuit component during the release etching process that removes the oxide material between the membrane and the backplate.

In some embodiments, the invention provides a means of manufacturing a CMOS-MEMS microphone system. The method includes a means of selectively protecting regions of a MEMS system from etch attack during a release process, by depositing a primary etch stop layer (also referred to as a passivation layer) adjacent to a ceramic adhesion layer. In one embodiment, the passivation layer may be deposited onto the top of a MEMS die and patterned to allow the release of an active MEMS structure while protecting other regions from release. When such a passivation layer is patterned and especially when the passivation is intended to protect a layer with a fast etch rate, it is important to have a good edge seal where ever the passivation layer is patterned in order to prevent undesired under etch around such a passivation layer. Therefore, the passivation layer must have low selectivity to the etchant and must adhere well to the base layers underneath such a passivation. This invention details a means of depositing a thin ceramic layer, such as an oxidized metal (e.g. $Al_2O_3$), as a bonding layer to promote adhesion of a thicker primary passivation layer (e.g. Silicon-rich silicon nitride). The ceramic bonding layer demonstrates both good adhesion to metal and polysilicon and good selectivity to common release etchants such as liquid HF and gas-phase HF.

In some embodiments the method includes depositing a protective etch stop on the top surface of a MEMS microphone system structure around the circumference of a MEMS component. A backside etch forms a cavity in the silicon substrate. A topside etch is then used to remove the oxide material surrounding the membrane and the sacrificial oxide defined gap layer between the membrane and the metal backplate. In some embodiments, all exposed surfaces are coated with a protective anti-stiction layer after the etching steps are complete.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
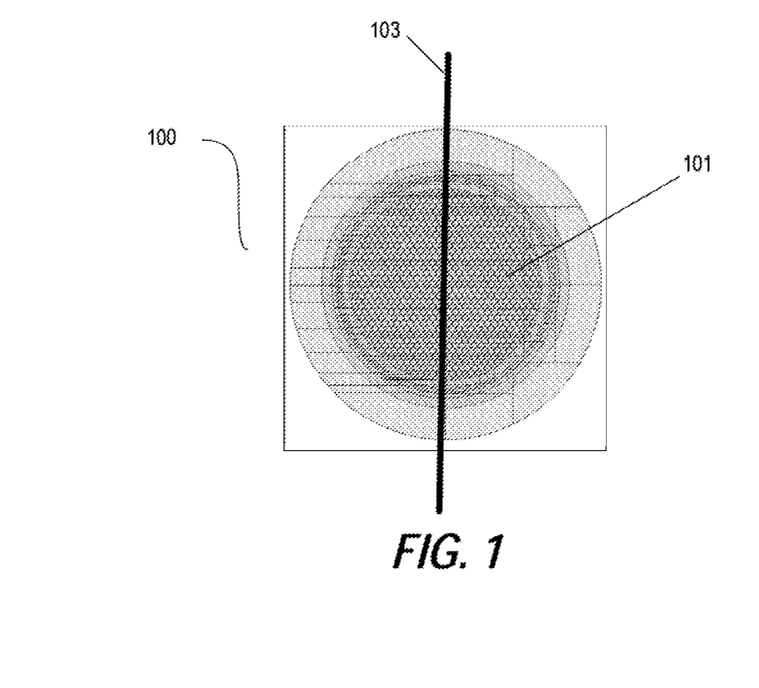
FIG. 1 is a top-side view of a CMOS-MEMS microphone system.

FIG. 1 shows a top-side view of a microphone system 100 that includes a MEMS circular shaped MEMS microphone 101. As described in further detail below, the MEMS microphone includes a membrane that moves in response to acoustic pressures and a backplate. An electrical circuit detects movement of the membrane relative to the backplate (e.g., due to varying capacitance) and generates an electrical signal indicative of the acoustic pressure (i.e., sound). The microphone system of FIG. 1 includes a CMOS and ASIC components integrated into the same monolithic structure as the MEMS microphone 101 and positioned around the periphery of the microphone membrane so as to avoid physical interference with the movement of the microphone membrane. Although the example of FIG. 1 shows a single circular microphone component 101 positioned in a square die, other constructions may include different arrangenments including, for example, microphones of other shapes (e.g., square or rectangular), silicon chips of other shapes, multiple microphones on the same chip, and varying amounts of chip surface around the periphery of the microphone 101.

Figure 2:
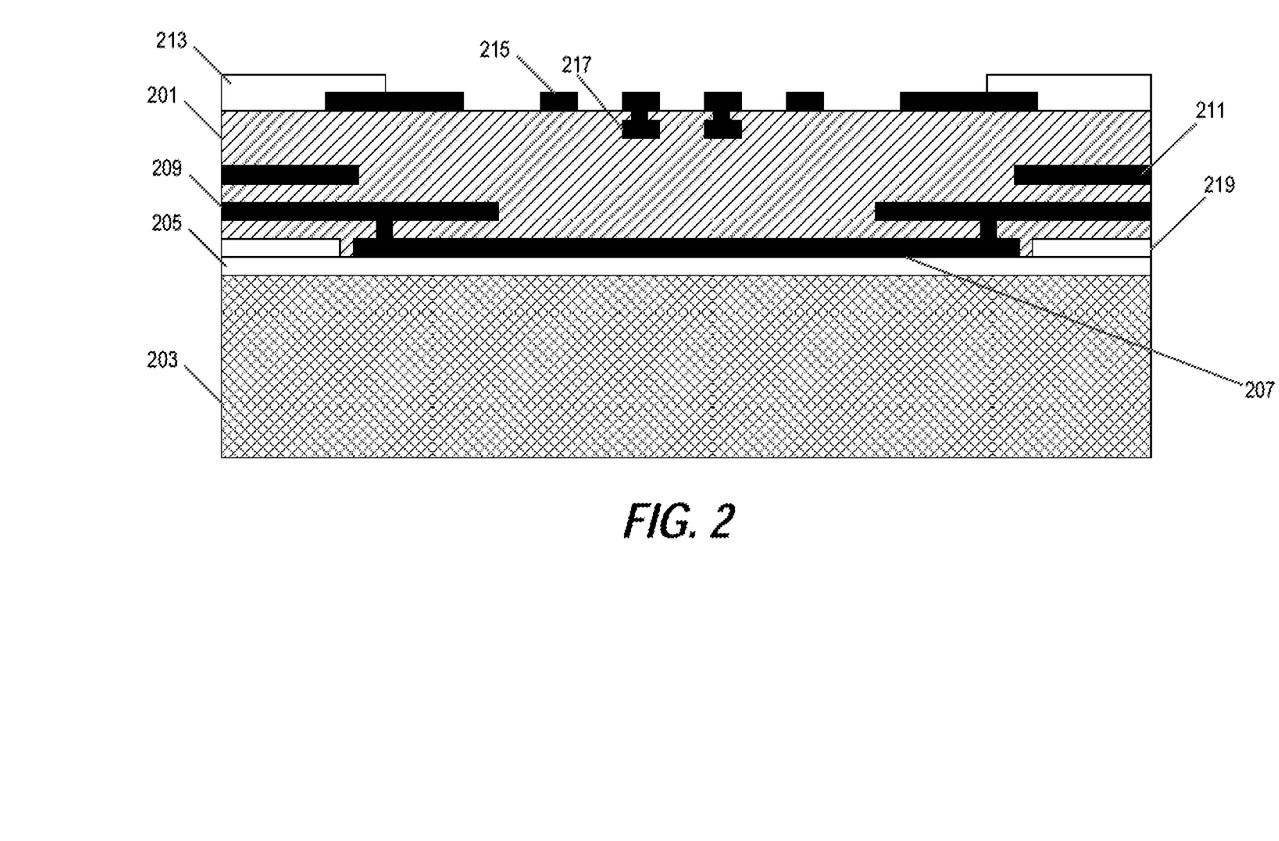
FIG. 2 is a cross-sectional view of a pre-etch CMOS-MEMS microphone system of FIG. 1.

FIG. 2 shows a cross-section of the microphone system 100 along line 103 to further illustrate the different layers and components of the monolithic structure. The monolithic structure in FIG. 2 is shown in its pre-etch state. The overall thickness of the wafer illustrated in FIG. 2 is approximately 400 μm after grind (approximately 725 μm before grind). The microphone system 100 includes a sacrificial, inter-metal dieletric (IMD) layer 201 positioned above a substrate layer 203. The IMD layer 201 is formed of undoped tetra-ethyl orthosilicate (TEOS) and the substrate layer 203 is formed of a silicon-based material. A LOCOS ("local oxidation of silicon") layer 205 is positioned between the IMD layer 201 and the silicon substrate layer 203.

A poly silicon membrane 207 is positioned within the IMD layer 201 above the LOCOS layer 205. The membrane is approximately 700 nm thick. As described in detail below, the membrane 207 will be released from the IMD layer 201 through an etch process so that it can move in response to acoustic pressures. As such, the wafer includes a clamped support structure 209 also imbedded in the IMD layer 201. When the membrane 207 is released, the clamped support structure 209 will remain partially imbedded in the remaining oxide layer 201 to provide an anchor support for the movable membrane 205.

A CMOS component 211 is also embedded in the IMD layer 201. In this example, the CMOS component 211 is formed outside the periphery of the microphone membrane 207. The CMOS component 211 is sized and positioned such that it does not extend into the physical space above or below the membrane 207. A passivation layer 213 (formed of a material such as SiN or $SiO_2$) is formed above the IMD layer 201. The portion of the passivation layer above the MEMS structure (i.e., the membrane 207) is removed prior to releasing the membrane 207.

A metal back plate 215 is positioned on top of the IMD layer 201 and is partially anchored by the passivation layer 213. The metal backplate 215 is grate-type structure with a plurality of gaps that will ultimately allow air to pass through as movement of the membrane 207 causes changes to the volume of the gap between the backplate 215 and the membrane 207. The backplate 215 in this example is approximately 2000 nm thick and is constructed in one or multiple layers of AlCu, Ti, and TiN. The backplate 215 also includes one or more over-travel stop formations 217 that prevent the membrane 207 from physically contacting the backplate 215.

Lastly, the wafer of FIG. 2 also includes an interlayer dielectric (ILD) component 219 positioned adjacent to the membrane 207 embedded in the IMD layer 201. In this example, this ILD component 219 is constructed of borophosphosilicate glass (BPSG) or NSG.

Figure 3:
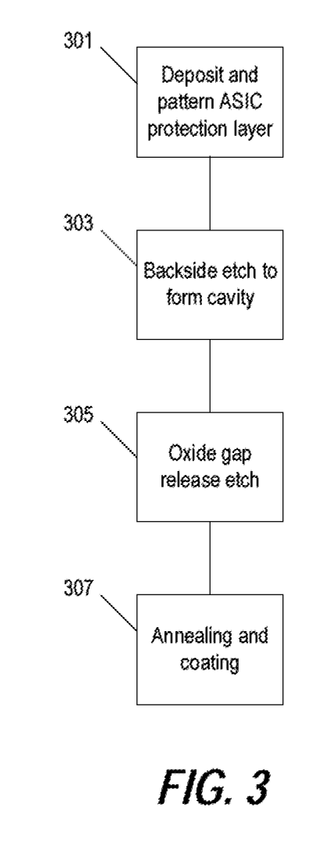
FIG. 3 is a flow chart illustrating a method of releasing the membrane in the CMOS-MEMS microphone system of FIG. 2.
Figure 4:
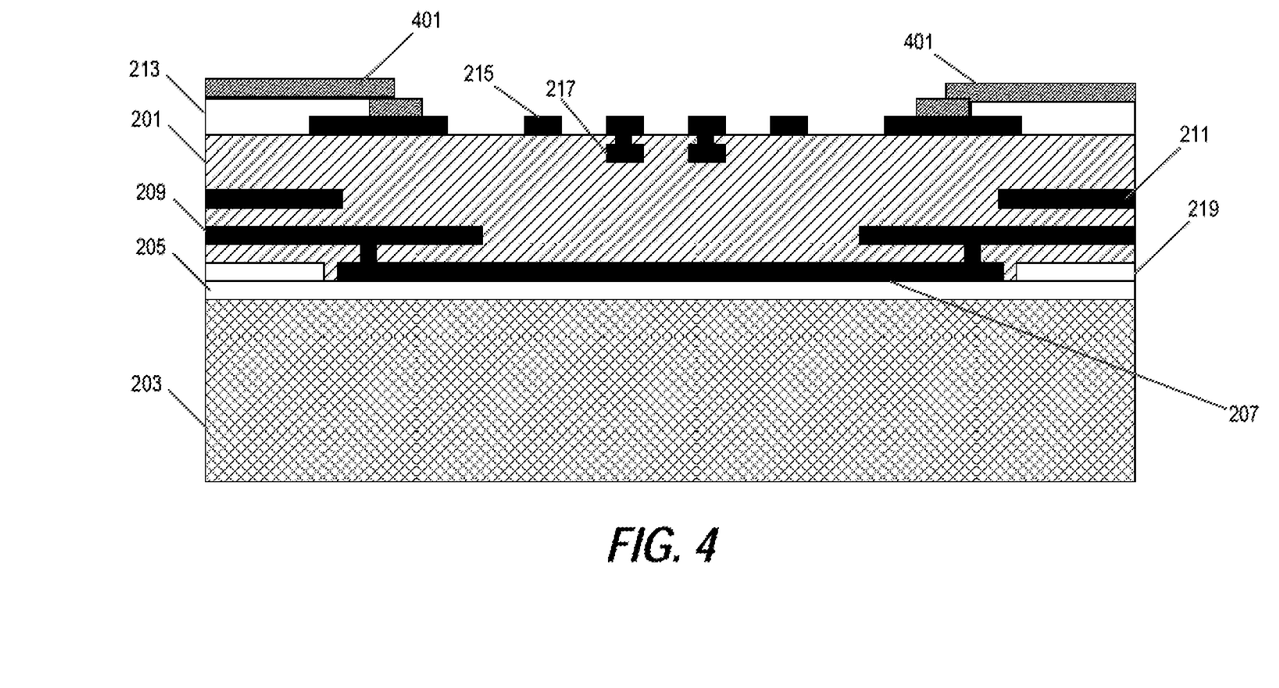
FIG. 4 is a cross-sectional view of the CMOS-MEMS microphone system of FIG. 2 after a protective layer is deposited and patterned.

FIG. 3 illustrates a method of etching the structure illustrated in FIGS. 1 and 2 to form a microphone cavity and to release the membrane 205 from the oxide layer. First, a protective layer is deposited on the top surface of the wafer (step 301). As illustrated in FIG. 4, the protective layer 401 is deposited above the passivation layer 213 and does not cover the MEMS structure (i.e., membrane 207 and backplate 215). The protective layer 401 can include anatomic layer deposited (ALD) and/or Silicon rich nitride material and will protect the ASIC/CMOS component 211 during the etching process described below.

Figure 5:
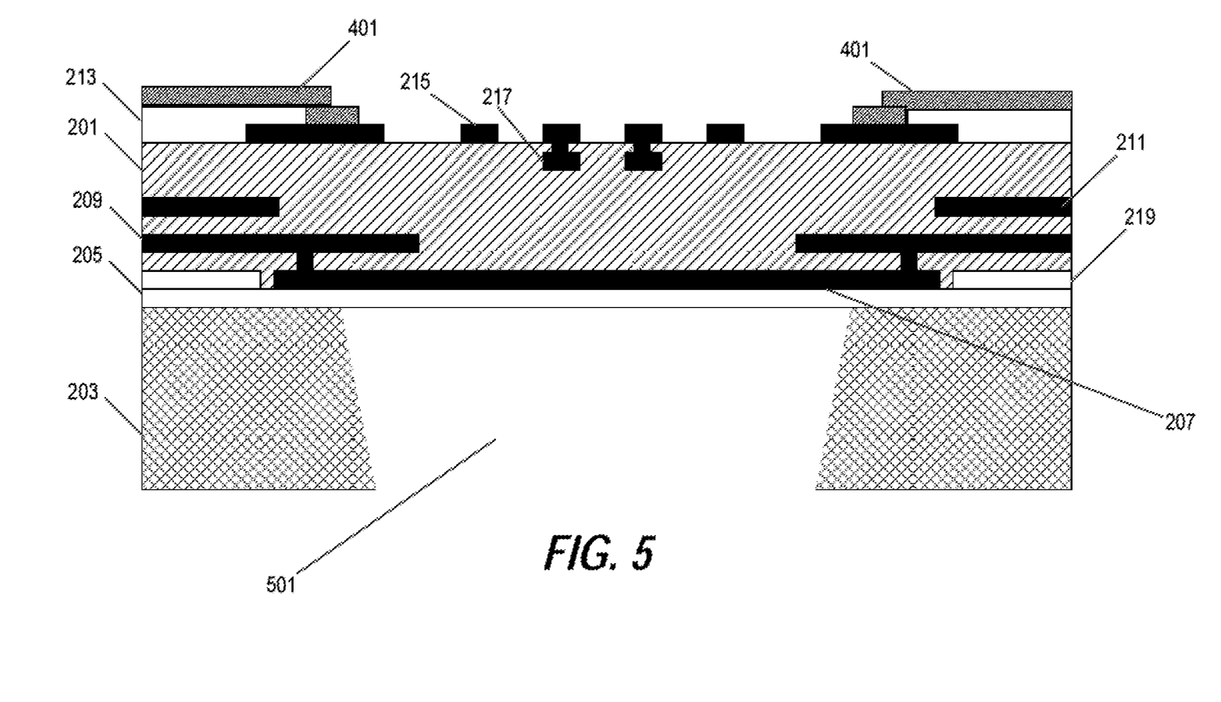
FIG. 5 is a cross-sectional view of the CMOS-MEMS microphone system of FIG. 4 after a backside etch is used to form a microphone cavity.

Returning to FIG. 3, after the protective layer is deposited, a backside etch is performed on the silicon substrate 203 to form a microphone cavity (step 303). As illustrated in FIG. 5, this etch (a silicon DRIE etch) removes a portion of the silicon substrate layer 203 below the membrane 205 to form an air gap 501 that serves as a cavity for the MEMS microphone. The $SiO_2$ of the LOCOS layer 205 serves as an etch stop underneath the poly silicon membrane 207 to prevent the silicon DRIE etch from damaging the membrane 207.

Figure 6:
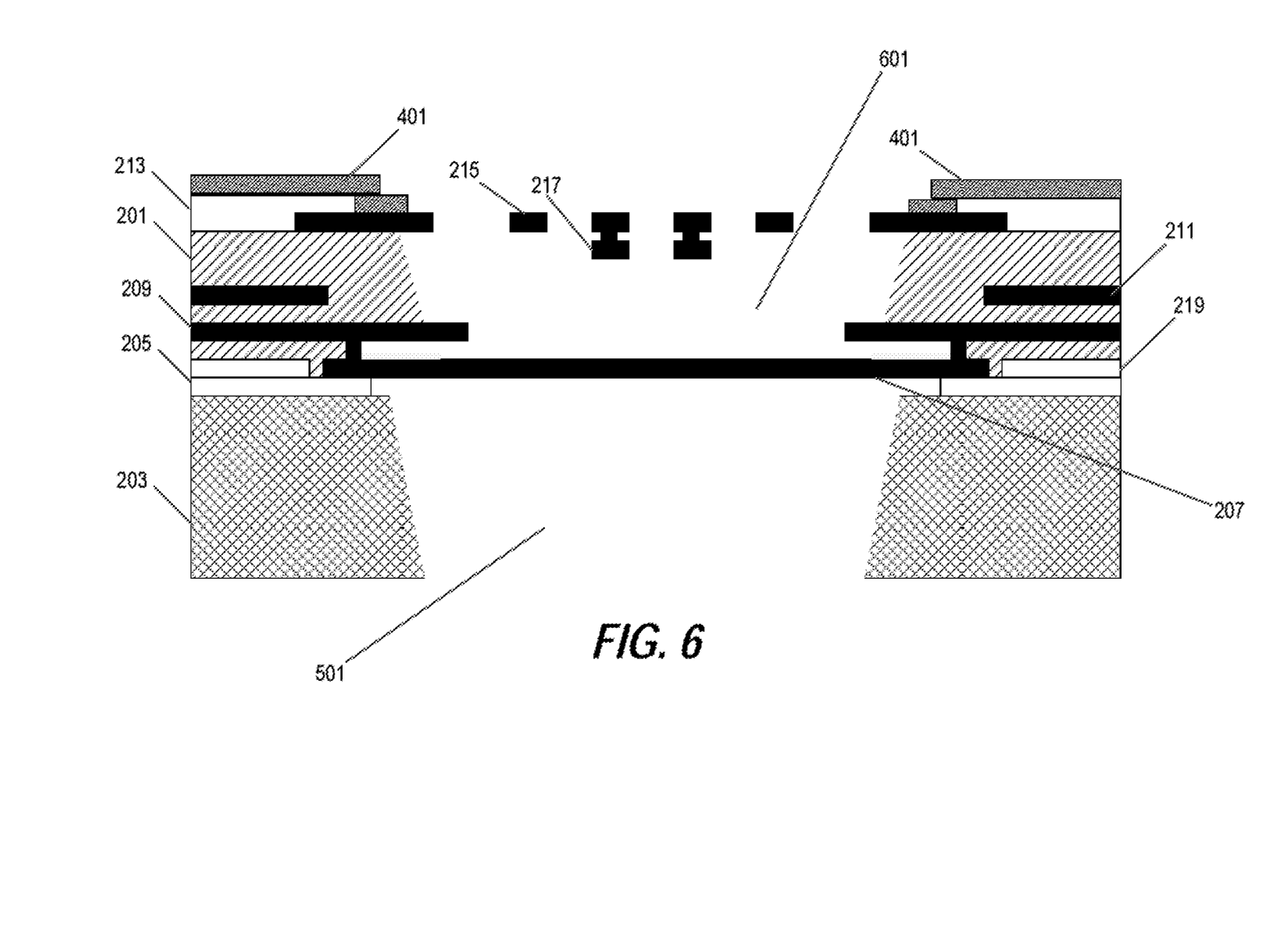
FIG. 6 is a cross-sectional view of the CMOS-MEMS microphone system of FIG. 5 after an oxide release etch is used to release the membrane from a sacrificial oxide layer.

Returning again to FIG. 3, after the microphone cavity is formed, an oxide etch is performed (step 305) to remove the sacrificial layer between the membrane 207 and the backplate 215 and to release the membrane 207 so that it can move in response to acoustic pressures. As illustrated in FIG. 6, this is a gas-phase or anhydrous vapor etch using hydrofluoric acid (i.e., a GPE-HF etch) to remove the oxide material of the IMD layer 201 below the metal backplate 215 to form a gap 601 between the backplate 215 and the membrane 207. After this etching step, the average mechanical gap between the backplate 215 and the membrane 207 is approximately 5.5 μm. This etch also removes the oxide LOCOS layer 205 to release the membrane 207 thereby allowing it to move in response to acoustic pressures. However, the protective layer 401 prevents the GPE-HF etch from damaging or removing the portions of the IMD layer 201 outside of the periphery of the MEMS structure and also protects the CMOS component 211 from damage.

Returning once again to FIG. 3, after the release etch is performed, the annealing and coating steps are performed (step 307) to protect the structure against moisture and stiction. During this process, all exposed surfaces of the MEMS structure and the rest of the die are coasted with an atomic layer deposited (ALD) coating and/or anti-stiction layer including, for example, an $ALD-SiO_2$ material.

Figure 7:
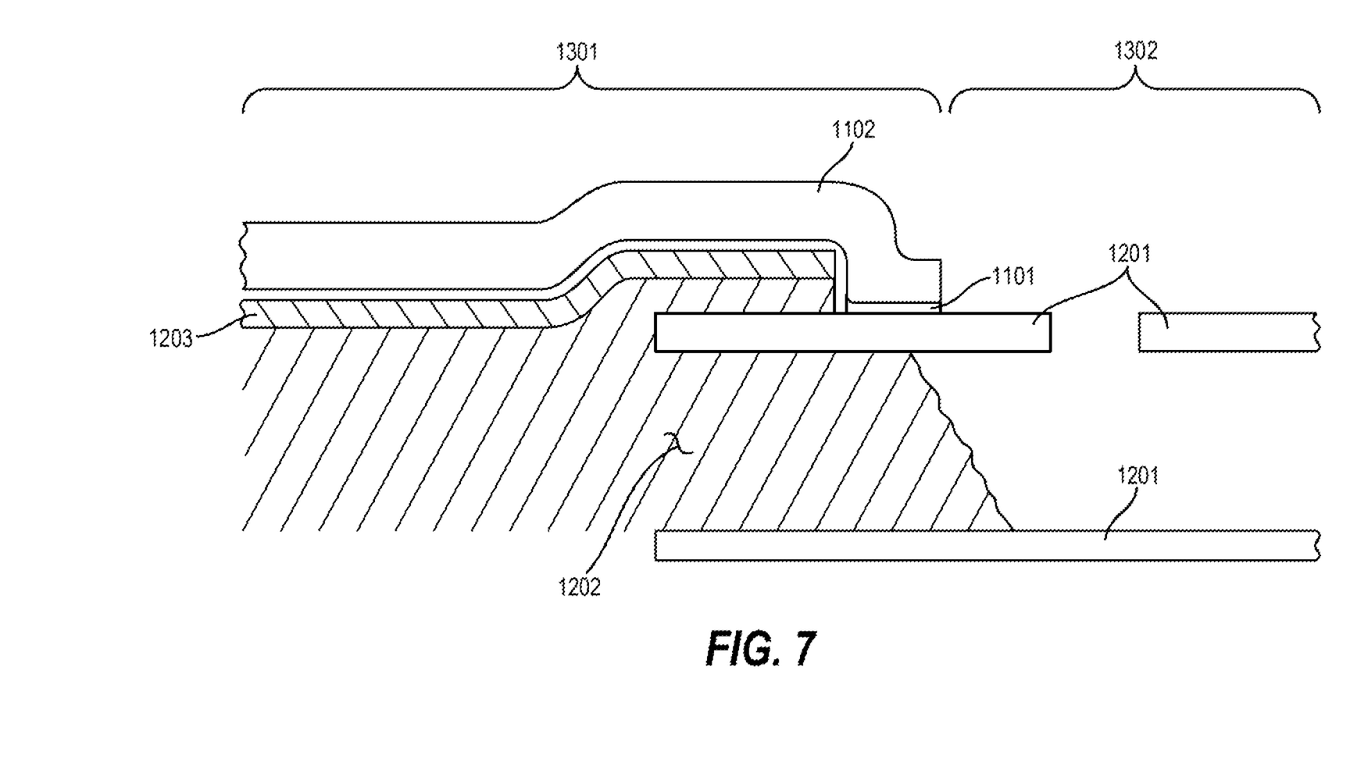
FIG. 7 is a cross-sectional view of another example of a CMOS-MEMS system.
Figure 8:
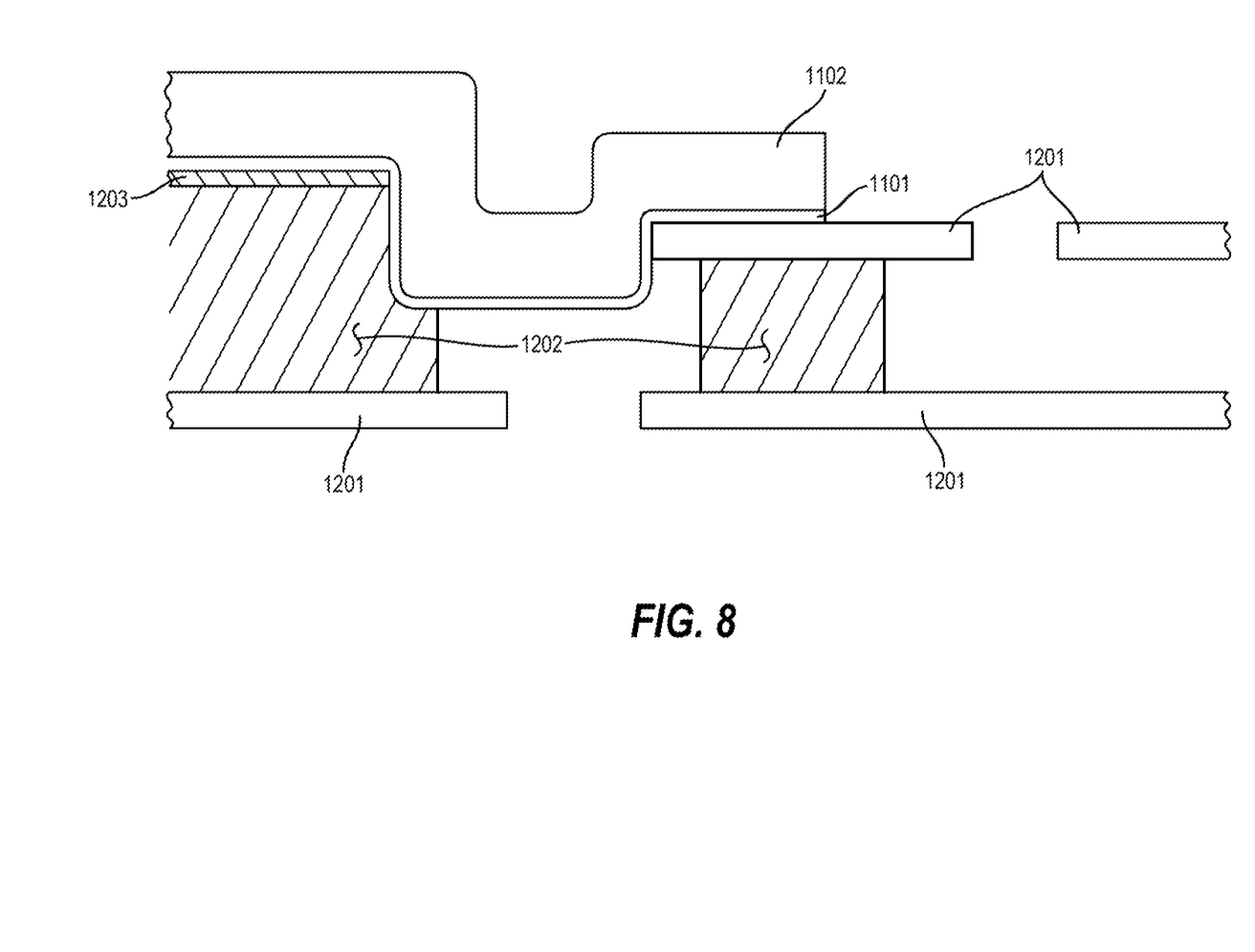
FIG. 8 is a cross-sectional view of a CMOS-MEMS system after an additional sacrificial etch is performed.

FIGS. 7 and 8 provide further cross-sectional views of other monolithic MEMS systems constructed using an etching/protection process such as described above. In FIGS. 7 and 8, region 1301 of the die is protected by the passivation layers to prevent underetching. Region 1302 includes the active MEMS components and sacrificial layers are intended to be removed to release a moving MEMS structure. A thin bonding layer 1101 (or "interface layer") is placed to promote passivation adhesion to the MEMS layers, thus preventing undesired under etch. In some embodiments, this bonding layer may consist of a ceramic material such as an oxidized metal (e.g. $Al_2O_3$) or any other material that is resistant to the HF etch process. A primary passivation layer 1102 protects regions of the MEMS device from release or from etch attach. Some components/layers 1201, due to their chemistry (e.g., metal, polysilicon, or silicon-rich silicon nitride) are not susceptible to etch attack while other sacrificial components 1202 are removed by the etching process to create a moving MEMS structure. Additional fast etching sacrificial layers 1203 are protected by the passivation layers to prevent underetching.

The layered structures of FIGS. 7 and 8 can also be assembled such that layer 1203 is the passivation layer and the thin layer 1101 provides top-side protection of the passivation layer 1203 during the top-side HF etch process. However, due to its thinness, the protective layer 1101 may be susceptible to scratching or other physical damage. Therefore, a second, thicker protective layer 1102 may be used to maintain the integrity of the thin protective layer 1101. In the example illustrated in FIG. 7, the thicker protective layer is made of a material such as silicon-rich nitride that it is also resistant to the HF etching process. However, other materials, such as silicon dioxide, can be used that are not necessarily resistant to the HF etch process. Although the HF etching process will deteriorate (and possibly completely remove) a silicon dioxide layer 1102, the thicker layer 1102 will serve its purpose of maintaining the physical integrity of the thinner, HF resistant layer 1101 until the HF etch is completed.

Thus, the invention provides, among other things, a method of manufacturing a CMOS MEMS system including a polysilicon membrane and a metal backplate with an oxide defined gap there between. The metal backplate can include one or more metal layers of the CMOS process. Furthermore, use of a protective etch stop layer positioned over the CMOS circuit, but not above the MEMS structure prevents damage to the CMOS circuit during the membrane release etch. An optional passivation bonding layer may also be included to promote adhesion of the protective etch stop to the MEMS layers.

The specific constructions and steps illustrated and described above provide only one example of a device manufactured according to this invention. In other constructions, the CMOS component may include a different size, shape or position. However, in such constructions, the protective layer still protects the CMOS component from damage during the release etch process. Furthermore, in some constructions, the monolithic die may include additional or alternative components incorporated into the MEMS structure, the CMOS, or other additional structures.

Various features and advantages of the invention are set forth in the following claims.

What is claimed is:

1. A method of manufacturing a CMOS-MEMS device, the method comprising:
   providing a layered structure including
      a substrate layer,
      a sacrificial layer,
      a MEMS membrane positioned between the sacrificial layer and the substrate layer within a MEMS region of a horizontal cross-section of the layered structure,
      a CMOS circuit component positioned within a circuit region of the horizontal cross-section of the layered structure, wherein the circuit region and the MEMS region do not overlap on the horizontal cross-section of the layered structure, and
      a MEMS backplate positioned adjacent to the sacrificial layer opposite the MEMS membrane;
   depositing a partial protective layer on a top surface of the layered structure, wherein the deposited partial protective layer covers the circuit region of the layered structure;
   performing a first partial etch of the substrate layer from a bottom side of the layered structure to form a first gap below the MEMS membrane within the MEMS region of the layered structure;
   performing a second partial etch of the sacrificial layer from a top side of the layered structure to form a second gap between the MEMS membrane and the MEMS backplate within the MEMS region of the layered structure,
      wherein the second partial etch releases the MEMS membrane so that it can move in response to pressures, and
      wherein the deposited partial protective layer prevents the second partial etch from etching a portion of the sacrificial layer positioned within the circuit region of the layered structure and from damaging the CMOS circuit component.

2. The method of claim 1, wherein the act of providing the layered structure includes manufacturing the layered structure according to a CMOS process.

3. The method of claim 1, wherein the MEMS membrane of the layered structure is formed of poly-Si material.

4. The method of claim 3, wherein the substrate layer of the layered structure is formed of a silicon-based material.

5. The method of claim 4, wherein the act of providing the layered structure includes providing a layered structure including a second protective layer between the MEMS membrane and the substrate layer within the MEMS region of the layered structure, and wherein the second protective layer acts as an etch-stop to protect the poly-Si MEMS membrane during the first partial etch of the substrate layer.

6. The method of claim 5, wherein the act of performing the first partial etch includes performing a silicon DRIE etch.

7. The method of claim 5, wherein the second protective layer is formed of an oxide material.

8. The method of claim 7, wherein the second protective layer is a local oxidation of silicon (LOCOS) layer.

9. The method of claim 7, wherein the sacrificial layer is formed of an oxide-based material and wherein the act of performing the second partial etch includes performing a second partial etch removing a portion of the sacrificial layer within the MEMS region of the layered structure and a portion of the oxide-based second protective layer within the MEMS region of the layered structure.

10. The method of claim 9, wherein the act of performing the second partial etch includes performing an etch from the top-side of the layered structure using hydrofluoric acid.

11. The method of claim 9, wherein the act of performing the second partial etch includes at least one selected from a group consisting of an anhydrous HF etch and a gas phase HF etc.

12. The method of claim 1, wherein the circuit region of the layered structure includes an area surrounding the MEMS region of the layered structure.

13. The method of claim 12, wherein the MEMS region includes a circular cross-sectional area.

14. The method of claim 1, wherein the act of providing the layered structure includes providing a layered structure including a passivation layer formed as the top surface of the layered structure within the circuit region of the layered structure, and wherein the act of depositing the partial protective layer includes depositing the partial protective layer on the passivation layer.

15. The method of claim 1, wherein the act of providing the layered structure includes providing a layered structure including a bonding layer between the passivation layer and the sacrificial layer, wherein the bonding layer promotes passivation adhesion between the layers and prevents under-etching of the portion of the sacrificial layer within the circuit region of the layered structure during the second partial etch.

16. The method of claim 15, wherein the bonding layer is formed of an oxidized metal material.

* * * * *